US006560571B1

(12) United States Patent
McBride

(10) Patent No.: US 6,560,571 B1
(45) Date of Patent: May 6, 2003

(54) METHOD AND APPARATUS FOR PRIORITIZING THE ORDER IN WHICH CHECKS ARE PERFORMED ON A NODE IN AN INTEGRATED CIRCUIT

(75) Inventor: John G McBride, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/345,079

(22) Filed: Jun. 30, 1999

(51) Int. Cl.[7] ............................................. G06F 17/50
(52) U.S. Cl. ................................. 703/14; 703/17; 716/4
(58) Field of Search ............................. 703/14, 17, 19; 716/1, 4, 18; 702/117

(56) References Cited

U.S. PATENT DOCUMENTS

| | | | | |
|---|---|---|---|---|
| 5,050,091 A | * | 9/1991 | Rubin ........................ | 364/488 |
| 5,528,508 A | * | 6/1996 | Russell et al. .............. | 364/488 |
| 5,844,818 A | * | 12/1998 | Kochpatcharin et al. ....... | 716/4 |
| 6,006,024 A | * | 12/1999 | Guruswamy et al. .. | 395/500.13 |
| 6,026,226 A | * | 2/2000 | Heile et al. ............ | 395/500.13 |
| 6,074,426 A | * | 6/2000 | Baumgartner et al. . | 395/500.14 |
| 6,182,020 B1 | * | 1/2001 | Fairbanks ................... | 702/117 |
| 6,185,726 B1 | * | 2/2001 | Chou .......................... | 716/18 |
| 6,311,309 B1 | * | 4/2002 | Southgate ..................... | 716/1 |
| 6,367,055 B1 | * | 4/2002 | McBride ....................... | 716/4 |
| 6,418,551 B1 | * | 7/2002 | McKay et al. ................. | 716/5 |

* cited by examiner

Primary Examiner—Kevin J. Teska
Assistant Examiner—T. Phan

(57) ABSTRACT

The present invention provides a method and apparatus for evaluating nodes in an integrated circuit to determine whether or not networks containing the nodes meet certain design criteria. The method and apparatus of the present invention are embodied in a rules checking system which evaluates the nodes in the integrated circuit to determine whether or not the networks in the integrated circuit comply with the design rules. Compliance with any particular rule is verified by performing one or more checks on the particular node being evaluated. Some checks require less time to perform than others. In some cases, the result of a single check can provide a determination as to whether or not the network containing the node being evaluated complies with the rule associated with the particular check. Furthermore, some checks are less expensive in terms of the amount of time required to perform them than other checks. Therefore, it is desirable to prioritize the order in which the checks associated with a particular rule are performed so that the rules checking tasks are performed with maximum efficiency. The rules checking system of the present invention prioritizes the checks so that efficiency in the overall rules checking process is maximized.

16 Claims, 7 Drawing Sheets

METHOD AND APPARATUS FOR PRIORITIZING THE ORDER IN WHICH CHECKS ARE PERFORMED ON A NODE IN AN INTEGRATED CIRCUIT

TECHNICAL FIELD OF THE INVENTION

The present invention generally relates to computer-aided circuit design systems and, more particularly, to a method and apparatus for prioritizing the order in which a series of checks are performed on nodes in an integrated circuit so that the checks are performed on each node in an order which maximizes efficiency.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EEPROMs), random access memory devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions, or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill, by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, PathMill performs a static timing analysis of a circuit using the netlist provided to PathMill. Furthermore, configuring PathMill to recognize various circuit characteristics is typically a very difficult task.

Accordingly, a need exists for a rules checking system that will allow circuits to be evaluated for design quality. A need also exists for a rules checking system which performs the rules checking tasks in a manner which maximizes efficiency. When a particular node is being evaluated by the rules checking system to determine whether or not the node complies with a particular design rule, it is advantageous to perform checks which are relatively inexpensive in terms of time before checks which are relatively expensive in terms of time are performed. Accordingly, a need exists not only for a rules checking system which evaluates the design quality of integrated circuits, but also for a rules checking system which prioritizes the order in which the rules checking tasks are performed in order to maximize efficiency.

SUMMARY OF THE INVENTION

The present invention provides a method and apparatus for evaluating nodes in an integrated circuit to determine whether or not networks containing the nodes meet certain design criteria. The method and apparatus of the present invention are embodied in a rules checking system which evaluates the nodes in the integrated circuit to determine whether or not the networks in the integrated circuit comply with design rules.

Compliance with any particular rule is verified by performing one or more checks on the particular node being evaluated. Some checks require less time to perform than others. In some cases, the result of a single check can provide a determination as to whether or not the network containing the node being evaluated complies with the rule associated with the particular check. Furthermore, some checks are less expensive in terms of the amount of time required to perform them than other checks. Therefore, it is desirable to prioritize the order in which the checks corresponding to each rule are performed so that the rules checking tasks are performed with maximum efficiency. Since each node preferably is evaluated, any realization in time savings with respect to any of the rules translates to a relatively large time savings over the entire rules checking process.

The apparatus of the present invention comprises logic configured to execute a rules checker algorithm. When the rules checker algorithm is executed by the logic, the algorithm evaluates nodes of the network and determines whether or not the network complies with various design rules. In accordance with the preferred embodiment of the present invention, the rules checker algorithm operates in conjunction with a static timing analyzer to build a database, which is then utilized by the rules checker algorithm to evaluate the networks. The algorithm is designed to perform the checks associated with each rule in accordance with a predetermined order which maximizes efficiency.

Preferably, the rules checker algorithm first performs checks which are least expensive in terms of the amount of time required to perform them in comparison to the other checks associated with the rule. If a check does not provide a determination as to whether or not the network of the node being evaluated complies with a particular rule, the algorithm performs a subsequent check. Each subsequently performed check is more expensive in terms of the amount of time required to perform it than the immediately preceding check. Therefore, the speed with which the rules checking tasks are performed is maximized.

Other features and advantages of the present invention will become apparent from the following description, drawings and claims.

DETAILED DESCRIPTION OF THE INVENTION

Figure 1:
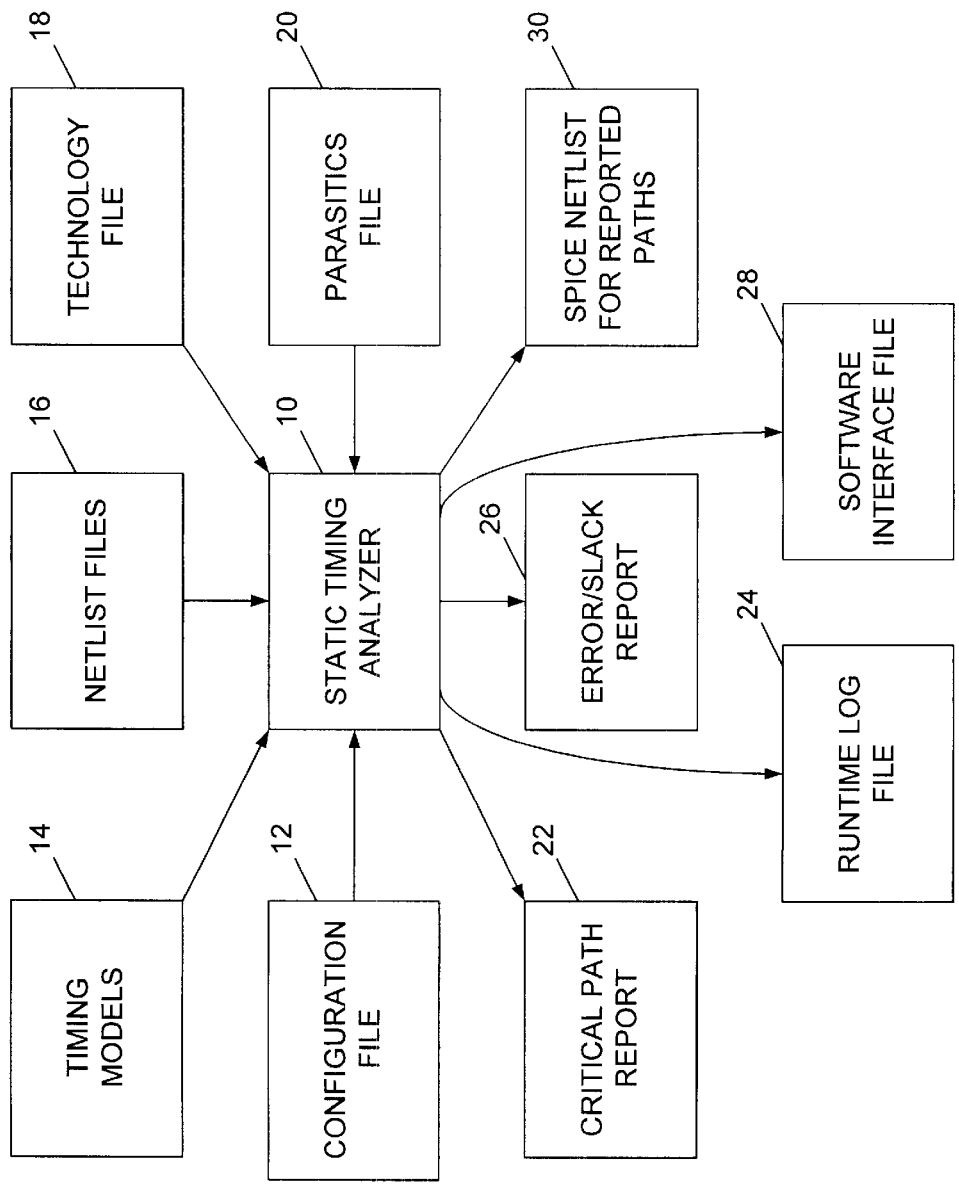
FIG. 1 is a block diagram of a static timing analyzer system, which is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations.

Figure 2:
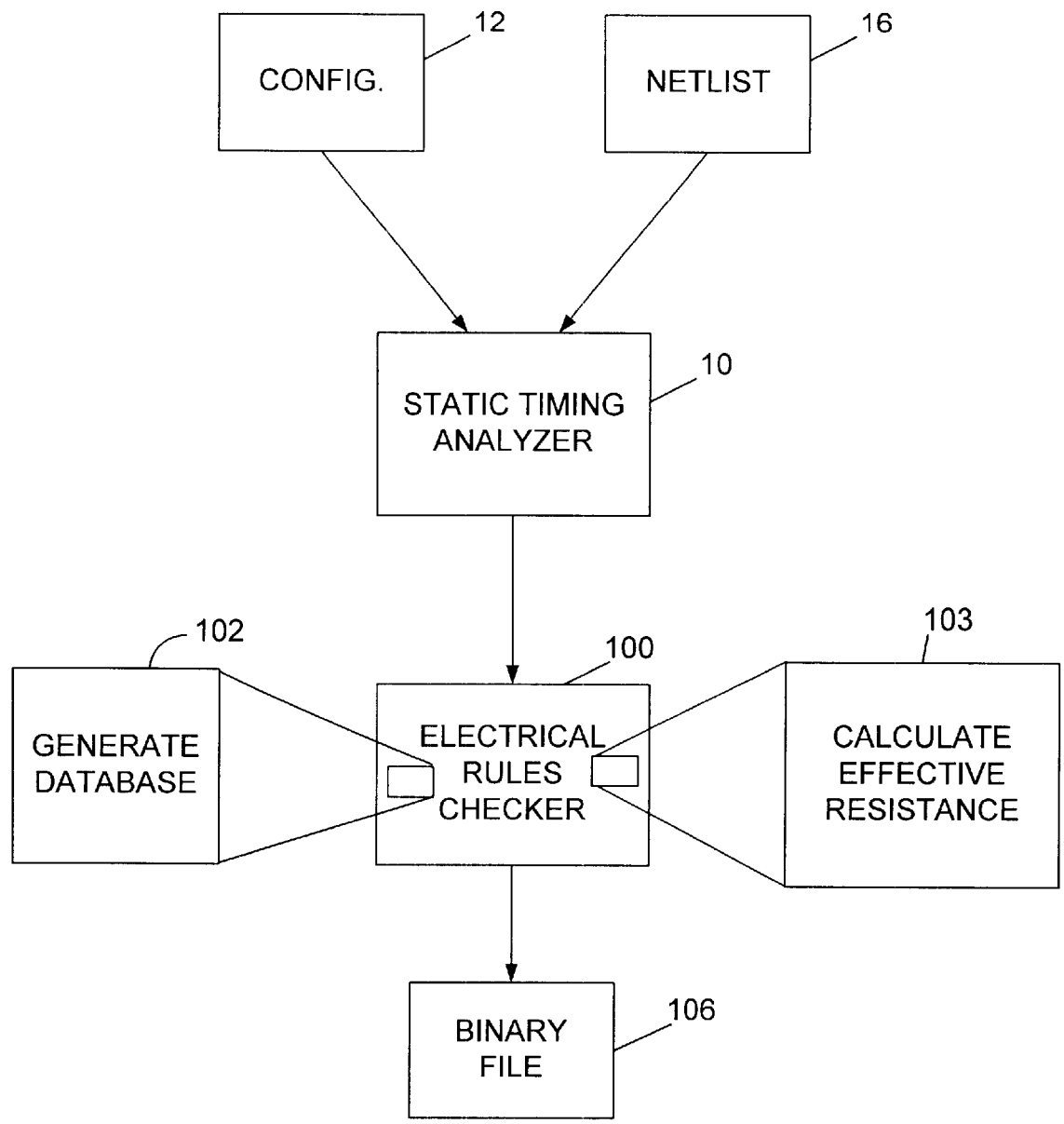
FIG. 2 is a block diagram illustrating the orientation of the electrical rules checker of the present invention in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion of the electrical rules checker program 100 may operate to identify predischarge nodes in an integrated circuit design. This is only one example of the multitude of checks that may be performed by the electrical rules checker program 100 of the present invention.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated preferably is generated. This database is then utilized by the electrical rules checker 100 of the present invention to perform the rules checking tasks. The manner in which this database is generated will now be discussed below with respect to FIGS. 3A–3C.

For purposes of illustration, it will be assumed that the static timing analyzer 10, shown in FIG. 2 and discussed above, is the Pathmill static timing analyzer, in order to provide an example of one possible implementation of the present invention. However, those skilled in the art will understand that the electrical rules checker 100 of the present invention and the database of the present invention are not limited to use with any particular program.

The Pathmill static timing analyzer provides an application program interface (API) which allows the Pathmill static timing analyzer to communicate with the electrical rules checker 100 of the present invention. This API allows code external to the Pathmill program to be linked to the Pathmill program so that the external code and the Pathmill program itself comprise one executable which can be run as a single program. The electrical rules checker 100 of the present invention utilizes this API to obtain information from the Pathmill static timing analyzer which can be utilized by the electrical rules checker 100 to generate the database of the present invention, as indicated by block 102. This database is then utilized by the rules checker program 100 to perform the rules checking tasks.

Prior to the database of the present invention being generated, the Pathmill program runs and identifies circuit characteristics of the circuit under consideration such as, for example, FET direction, node types, latches, dynamic gates, clocks, rise and fall times, etc. Before the Pathmill program terminates, it calls the electrical rules checker 100 of the present invention. The Pathmill program has a feature commonly referred to as "hooks", which allows the Pathmill program to call routines at various stages of execution. Once the Pathmill program has finished identifying the characteristics mentioned above, the Pathmill program calls the electrical rules checker 100 of the present invention. The electrical rules checker 100 of the present invention, through this series of subroutine calls, creates its own database of the circuit under consideration.

Figure 3A:
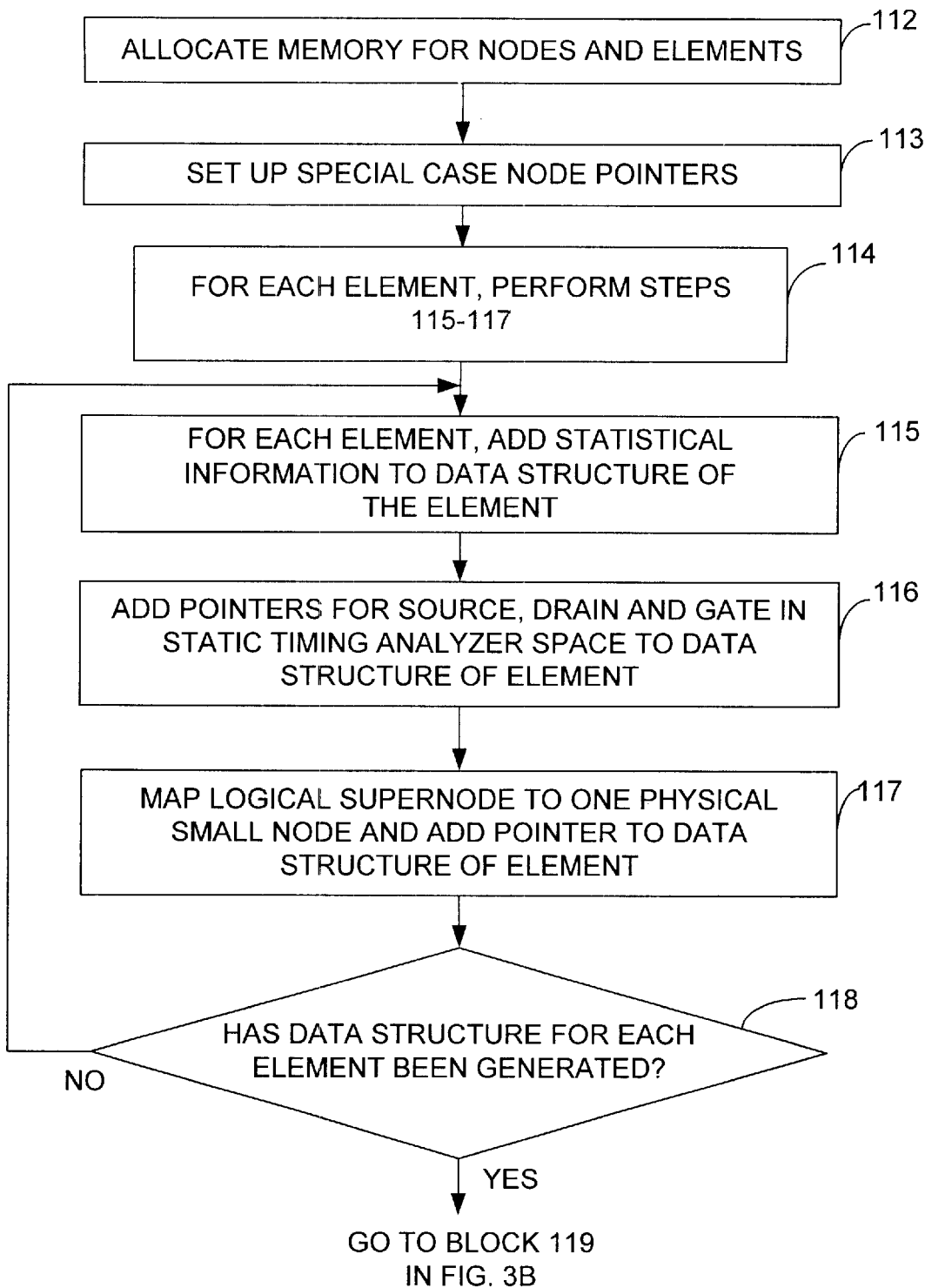
FIGS. 3A–3C together form a flow chart which illustrates the method of the present invention for generating the database of the present invention which can be utilized by the electrical rules checker of the present invention shown in FIG. 2 to perform rules checking tasks.
Figure 3B:
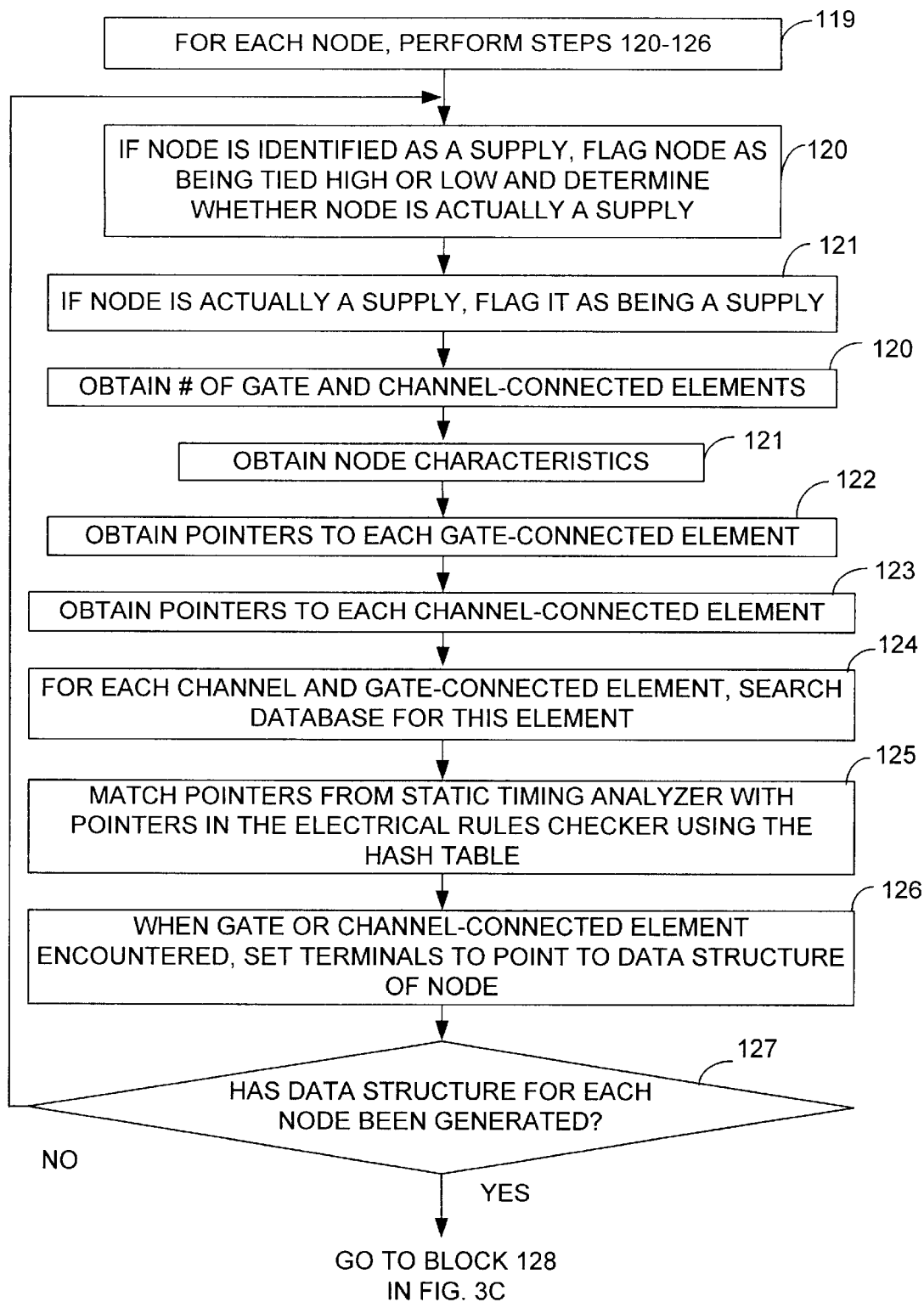

The first step in the process of generating the database is to allocate memory for the nodes and elements of the circuit, as indicated by block 112 in FIG. 3A. The Pathmill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated.

However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 114. These special types of nodes will be used repeatedly during the process of generating the database, as discussed below in more detail. Therefore, the pointers for these nodes preferably are set up relatively early in the database generation process. For example, nodes which correspond to ground (GND) and to the supply voltage ($V_{DD}$) are special types of nodes and it is helpful to set up node pointers for these types of nodes. However, those skilled in the art will understand that this step, although it is preferable, is not necessary, but rather, is used to optimize efficiency in the database generation process of the present invention.

For each element, a data structure must be generated which can be utilized by he electrical rules checker 100 in performing the rules checking tasks. Steps 115–117 in FIG. 3A correspond to the steps for creating the element data structures. For each element, a data structure is defined and statistical information relating to the element is added to the data structure of the element, as indicated by block 115. This information includes, for example, the width of the element, the length of the element, the direction of the element, and the element type.

Once the statistical information has been included in the data structure of the element, the pointers for the source, drain and gate of each element, as defined in the space of the static timing analyzer, are included in the data structure of the element, as indicated by block 116. The pointers that were set up in step 114 are utilized in step 116. If either the source, drain or gate of the element is attached to ground or VDD, then the pointers for the source, drain and gate are set to the pointers for ground or VDD obtained in step 114.

A node in a circuit can be represented logically or physically. A logical representation of an element includes only FETs and does not include any resistors. This logical representation is identified in the Pathmill program as a "supernode". The logical representation does not account for parasitic resistance. On the other hand, a physical representation of a node, which is identified in the Pathmill program as a small node, includes FETs, but also includes resistors, which correspond to the parasitic resistance in the node. Therefore, in the physical representation, a small node exists between the resistors representing the parasitic resistance and between any FET and any one of the resistors. Each element has a pointer to a supernode and to a small node for each drain, source and gate. Therefore, there are six pointers for each FET.

All of the small nodes in the physical representation map to the same supernode in the logical representation. In Pathmill, the supernode of the logical representation is mapped to one of the physical small nodes, and vice versa. In block 117, the pointers corresponding to these nodes are added to the data structure of the element.

Once the data structures for the elements have been generated, the data structures for the nodes must be generated. Blocks 118–120 in FIG. 3A and blocks 121–126 in FIG. 3B correspond to the steps in the process of the present invention for generating the data structures of the nodes. In block 118, a determination is made as to whether a node has been identified by the Pathmill program as a supply. The Pathmill program identifies all nodes as supplies if the nodes are either tied high or low. If the node has been identified by the Pathmill program as corresponding to a supply, the node is flagged and the flag will indicate whether the node is tied high or whether it is tied low. A determination is then made as to whether the node is actually a supply, i.e., whether the node actually corresponds to ground or $V_{DD}$. If a determination is made that the node is actually a supply, the node is flagged as corresponding to a supply, as indicated by block 119.

The electrical rules checker 100 then obtains the number of gate-connected elements and the number of channel-connected elements from the static timing analyzer, as indicated by block 120. The electrical rules checker 100 also obtains the characteristics of the nodes from the static timing analyzer 10, as indicated by block 121. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 122. The electrical rules checker 100 then obtains the pointers from the static timing analyzer which point to each channel-connected element, as indicated by block 123. Then, for each channel-connected element and for each gate-connected element, the electrical rules checker 100 searches its database to find an element in the space of the electrical rules checker 100 that corresponds to the element under consideration, as indicated by block 124.

The pointers for the elements provided by the static timing analyzer 10 are then matched with the pointers for the corresponding elements in the electrical rules checker 100 using a hash table which converts the pointers in the space of the static timing analyzer 10 into pointers in the space of the electrical rules checker 100, as indicated by block 125. Generally, each of the pointers in the space of the static timing analyzer corresponds to a hash key and when the hash key is plugged into the hash table, the pointer in the space of the electrical rules checker is output from the hash table. Hash tables and the manner in which they are utilized are well-known in the art. Therefore, a detailed discussion of the manner in which the pointers in the space of the static timing analyzer are converted using the hash table into pointers in the space of the electrical rules checker 100 will not be provided herein since persons skilled in the art will understand the manner in which this can be accomplished.

Once these steps have been performed, the electrical rules checker 100 has at its disposal a list of channel-connected elements and gate-connected elements as well as their pointers in the space of the electrical rules checker 100. In generating the node data structures, when the electrical rules checker 100 encounters a node that is connected to one of these channel-connected or gate-connected elements, the electrical rules checker 100 sets the terminals of the element to point to the data structure of the node under consideration, as indicated by block 126. The process then returns to the step in block 120 and generation of the data structure for the next node begins, as indicated by decisional block 127.

Figure 3C:
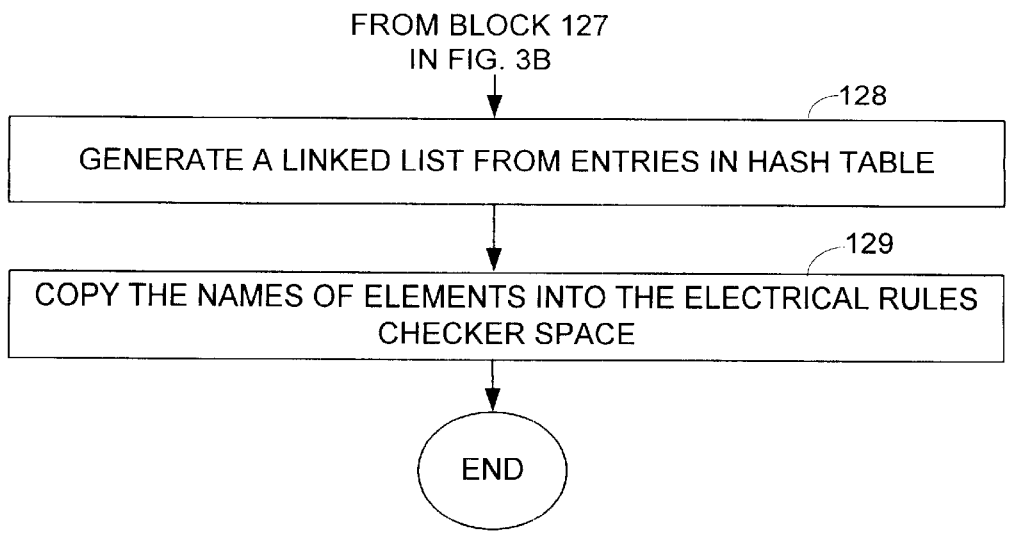

In order to enable the electrical rules checker 100 to maximize efficiency in searching the database of the present invention, once the data structures for all of the nodes have been created, a linked list is generated from the entries in the hash table, as indicated by block 128 in FIG. 3C. Every location in the hash table will not contain a valid entry. Therefore, in order to maximize efficiency in searching the database, a linked list is generated which links the valid entries in the hash table together such that each valid entry in the hash table points to the next valid entry in the hash table, as indicated by block 128. Thus, when the electrical rules checker 100 of the present invention is searching for an element in the database of the present invention, the electrical rules checker 100 simply analyzes the elements contained in the linked list.

It should be noted that the arrangement of the elements in the linked list may or may not have any physical relationship to the arrangement of the elements in the circuit under consideration. Thus, the linked list is merely used to search through the elements stored in the database. Once the linked list has been generated, the names of the elements contained in the linked list are copied into electrical rules checker space, as indicated by block 129. This reduces the number of calls that need to be made to the Pathmill program by the electrical rules checker 100. Once the database of the present invention has been generated, no more calls have to be made to the Pathmill program via the Pathmill. The database of the present invention is comprised as the binary file 106 shown in FIG. 2.

Once the database of the present invention has been generated in the manner described above, the electrical rules checker 100 of the present invention utilizes this database to perform the rules checking tasks. However, it should be noted that the generation of the database is not critical to the present invention, as will be understood by those skilled in the art. Utilization of the database of the present invention enables the rules checker 100 to maximize efficiency in performing its tasks and reduces the number of API calls to the timing analyzer 10.

In accordance with the present invention, the electrical rules checker 100 performs the rules checking tasks in a manner which maximizes the overall efficiency of the rules checking process. As stated above, compliance with any particular rule is verified by performing one or more checks on the particular node being evaluated. Some checks require less time to perform than others. In some cases, the result of a single check can provide a determination as to whether or not the network containing the node being evaluated complies with the rule associated with the particular check. Furthermore, some checks are less expensive in terms of the amount of time it takes to perform them than other checks. Therefore, it is desirable to prioritize the order in which the checks corresponding to each rule are performed so that the rules checking tasks are performed with maximum efficiency. The manner in which this prioritization is accomplished will be discussed below in detail with reference to FIGS. 4–6.

Figure 4:
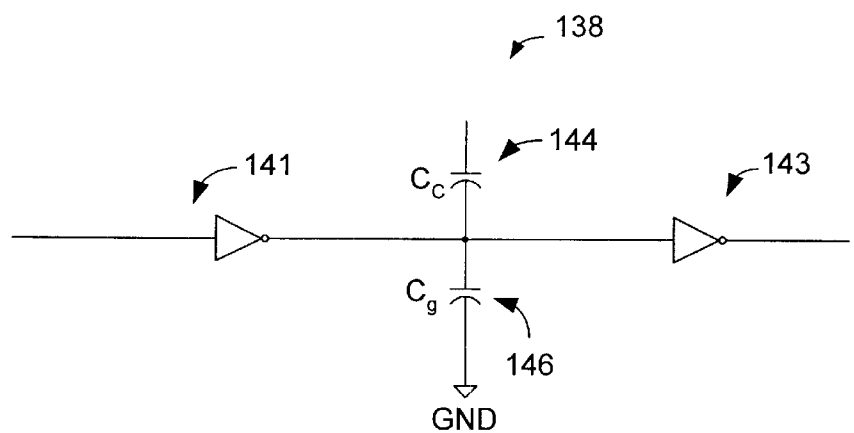
FIG. 4 is a schematic diagram of an example of a typical network which the electrical rules checker of the present invention shown in FIG. 2 will evaluate for compliance with a particular rule.

FIG. 4 is a schematic diagram of a network 138 comprised in an integrated circuit, which will be utilized to demonstrate an exemplary application of the method and apparatus of the present invention whereby the rules checking process is prioritized in order to maximize efficiency. The network 138 comprises first and second inverters 141 and 143, respectively, and parasitic capacitances 144 and 146. The parasitic capacitance 144 corresponds to a cross-coupling capacitance. Generally, cross-coupling capacitance contributes to noise in a network 138. This cross-coupling capacitance will, in some cases, result in the network 138 being impermissibly noisy.

One of the rules that nodes are tested for compliance with is directed to testing nodes to determine whether cross-coupling capacitance will result in more noise than is tolerable. This rule is one of many rules that are used by the electrical rules checker 100 of the present invention to test networks for architectural compliance. This rules comprises a plurality of different checks, which are discussed below in detail with reference to FIG. 6. This particular rule will be used herein to provide an example of the manner in which the electrical rules checker 100 prioritizes checks in order to maximize efficiency in the overall rules checking process.

However, it will be understood by those skilled in the art that the present invention is not limited to prioritizing the checks associate with this particular rule. Those skilled in the art will understand that the prioritization technique of the present invention is equally applicable to any rule that is, or may be, used to test networks for architectural compliance.

Figure 5:
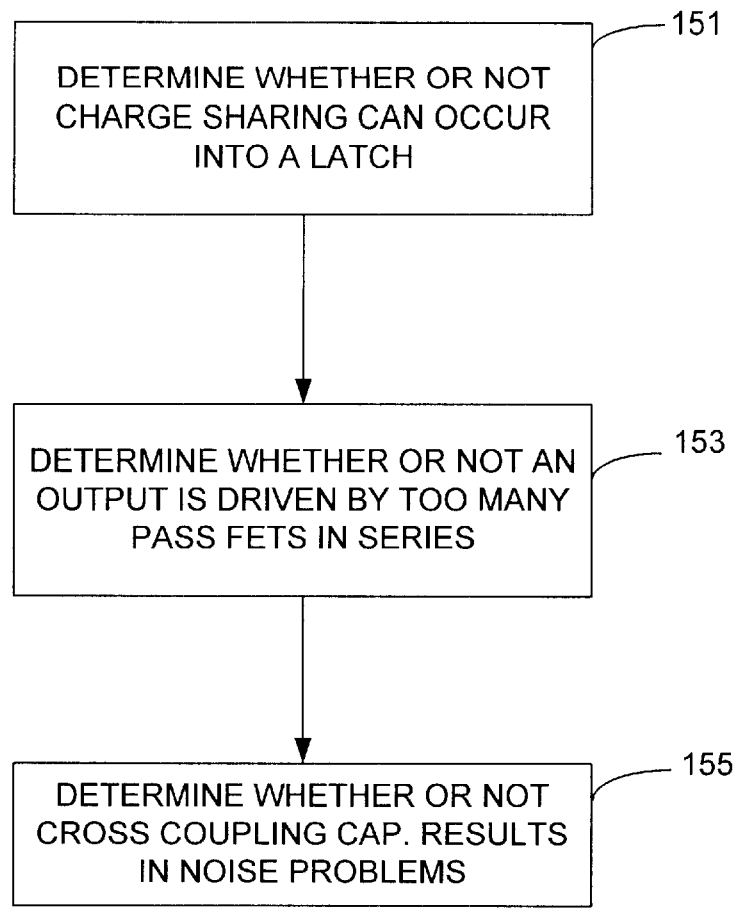
FIG. 5 is a flow chart illustrating an example of various types of rules that the electrical rules checker shown in FIG. 2 may apply to nodes of a network for the purpose of testing architectural compliance of the network.
Figure 6:
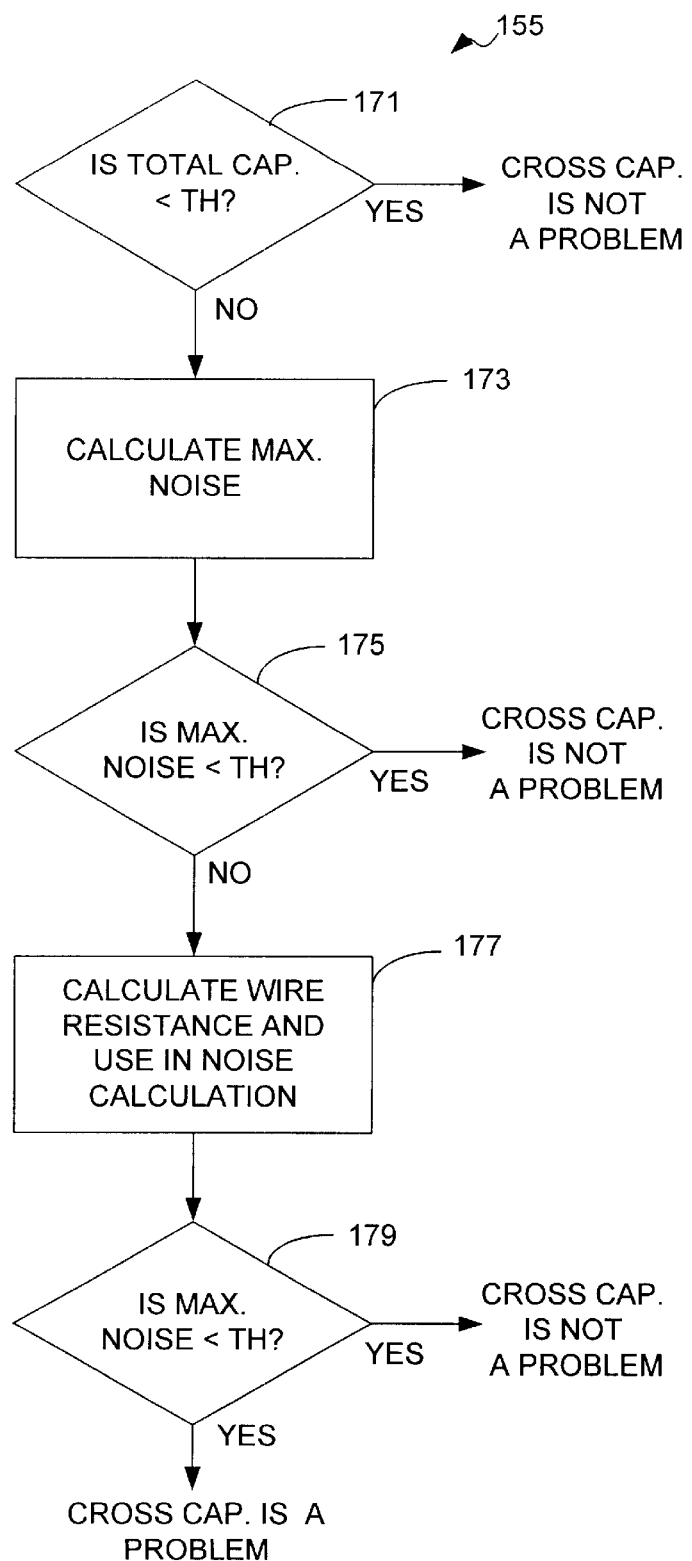
FIG. 6 is a flow chart illustrating an example of the manner in which the electrical rules checker prioritizes checks associated with a particular rule.

Prior to describing the cross-coupling rule illustrated in FIG. 6, a brief discussion will be provided of various types of rules that the electrical rules checker 100 may test nodes for to determine whether or not a network is architecturally compliant. The flow chart of FIG. 5 illustrates three different rules. These rules are merely examples of the types of rules that may be used to evaluate networks.

The order in which the rules are listed in the flow chart of FIG. 5 is not relevant, but has been chosen merely for exemplary purposes. A first rule 151 is applied to determine whether or not it is possible for charge sharing to occur into a latch from a multiplexer. A second rule 153 is applied to determine whether or not an output node is driven by too many pass FETs in series. A third rule 155 is applied to determine whether or not a node is overly susceptible to noise attributable to cross-coupling capacitance.

Each of these rules can be viewed as comprising a plurality of individual checks. However, all of the checks associated with a particular rule do not necessarily need to be performed in order to determine the outcome of the application of the rule. For example, there may be four different checks that can be performed to determine whether or not a node is part of a latch structure, as represented by block 151. One of the checks may require less time for the electrical rules checker 100 to perform it than all of the other checks. Similarly, one of the checks may require more time for the electrical rules checker 100 to perform it than all of the other checks.

It is generally desirable to perform the least time-consuming check first if the result of this check provides a determination as to whether or not the node is part of a latch structure. Similarly, it is generally desirable to perform the most time-consuming check after all of the other checks have been performed and only if the other checks did not definitively determine that the node is or is not part of a latch structure. It is also desirable to prioritize all of the other checks associated with the rule so that they are performed in an order from the least to the most time consuming and only if a previous check did not definitively determine that the node is or is not part of a latch structure.

However, it should be noted that the amount of time that it takes to perform the checks is not the only factor considered in determining the sequence in which the checks are to be performed. Other factors, such as, for example, whether the results of a check will be used by other checks. If so, the check that produces results to be used by other checks will be performed earlier in the sequence, even if the check performed first is more computationally intense. Another factor that may be taken into consideration is data locality. If certain checks require data from a particular location in the network, some or all of these checks may be performed in series. Therefore, a variety of factors are taken into consideration in order to obtain the shortest run time required for the rules checker program to perform its rules checking tasks.

FIG. 6 is a flow chart which illustrates the checks associated with the rule represented by block 155. The flow chart of FIG. 6 will be used to demonstrate the manner in which the checks associated with a particular rule are prioritized in order to maximize efficiency in the overall rules checking process. When calculating noise associated with cross-coupling capacitance, the parasitic resistance attributable to the resistance of the metal conductors of the network should be taken into account. However, extracting the parasitic resistances associated with the network and calculating the effective wire resistance is a relatively time consuming process.

However, a determination can be made as to whether or not the cross-coupling capacitance will result in a network that is overly sensitive to noise without taking the parasitic resistances into account. This is accomplished by comparing the ratio $C_c/(C_c+C_g)$, which corresponds to the total cross-coupling capacitance associated with the network 138 shown in FIG. 4, to a threshold value, as indicated by block 171. If the total capacitance is less than the threshold value, TH, then the electrical rules checker 100 determines that the cross-coupling capacitance will not create a noise problem.

If it is not definitively determined at block 171 that the cross-coupling capacitance will not create a noise problem, then the maximum possible noise level associated with the cross-coupling capacitance will be calculated. As stated above, this calculation utilizes the parasitic resistance of the network to calculate the effective wire resistance, which is a variable used in the noise calculation. Rather than extracting the parasitic resistances and calculating the effective wire resistance, the maximum possible noise level associated with the cross-coupling capacitance is calculated using a range of resistance values selected to create a worst case scenario. This step is represented by block 173. The maximum possible noise level is then compared to a threshold value, TH, to determine whether or not the maximum possible noise level corresponds to a permissible noise level. This step is represented by block 175.

If a determination is not made at block 175 that the maximum possible noise level corresponds to a permissible noise level, then the parasitic resistances must be extracted and the actual effective wire resistance must be calculated. The actual effective wire resistance is then used in the noise calculation, as indicated by block 177. A determination is then made at block 179 as to whether or not the network is overly sensitive to noise caused by cross-coupling capacitance.

It will be understood by those skilled in the art that the prioritization technique of the invention is not limited to any particular rule or set of rules. Those skilled in the art will understand, in view of the teachings provided herein, that many rules that may be used to test integrated circuit designs for architectural compliance can be parsed into a plurality of checks which can be prioritized in order to maximize efficiency.

It should be noted that the foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. An apparatus for evaluating nodes of a network of an integrated circuit to determine whether or not the network complies with various design rules, the apparatus comprising:

logic configured to perform a rules checker algorithm, wherein when the rules checker algorithm is performed, the rules checker algorithm evaluates at least one of the nodes of the network to determine whether or not the network complies with at least one of the design rules, wherein said at least one of the design rules is comprised of a plurality of checks, each check being capable of being performed by the rules checker algorithm in a particular amount of time, wherein less time is required for the rules checker algorithm to perform a first one of the checks than is required for the rules checker algorithm to perform a second one of the checks, and wherein the rules checker algorithm performs the first check before the rules checker algorithm performs the second check, and wherein the second check is only performed by the rules checker algorithm if performance of the first check does not provide a definitive determination as to whether or not said at least one of the design rules has been complied with by the network comprising the node being evaluated.

2. The apparatus of claim 1, wherein the order in which the checks are performed by the algorithm has been pre-selected to maximize efficiency of the apparatus in evaluating the nodes for compliance with the design rules.

3. The apparatus of claim 2, wherein the first check performed by the algorithm is capable of being performed by the algorithm in a lesser amount of time than the amount of time required for the algorithm to perform any check other than the first check, and wherein each of the checks is capable of definitively determining that the network comprising the node being evaluated either does or does not comply with said at least one of the design rules.

4. The apparatus of claim 3, wherein each check performed by the algorithm is performed in accordance with the amount of time required to perform each check, wherein the check requiring the shortest time to perform is performed first.

5. The apparatus of claim 4, wherein the logic corresponds to a computer and the algorithm corresponds to software capable of being executed by the computer.

6. An apparatus for evaluating nodes of a network of an integrated circuit to determine whether or not the network complies with various design rules, the apparatus comprising:

means for evaluating at least one of the nodes of the network to determine whether or not the network complies with at least one of the design rules, wherein said at least one of the design rules is comprised of a plurality of checks, each check being capable of being performed by the means in a particular amount of time, wherein less time is required for the means to perform a first one of the checks than is required for the means to perform a second one of the checks, and wherein the means performs the first check before the means performs the second check, and wherein the second check is only performed by the means if performance of the first check does not provide a definitive determination as to whether or not said at least one of the design rules has been complied with by the network comprising the node being evaluated.

7. The apparatus of claim 6, wherein the order in which the checks are performed by the means has been pre-selected to maximize efficiency of the apparatus in evaluating the nodes for compliance with the design rules.

8. The apparatus of claim 7, wherein the first check performed by the means is capable of being performed by the means in a lesser amount of time than the amount of time required for the means to perform any check other than the first check, and wherein each of the checks is capable of definitively determining that the network comprising the node being evaluated either does or does not comply with said at least one of the design rules.

9. The apparatus of claim 8, wherein each check performed by the means is performed in accordance with the amount of time required to perform each check, wherein the check requiring the shortest time to perform is performed first.

10. A method for evaluating nodes of a network of an integrated circuit to determine whether or not the network complies with various design rules, the method:

evaluating at least one of the nodes of the network to determine whether or not the network complies with at least one of the design rules, wherein said at least one of the design rules is comprised of a plurality of checks, each check requiring a particular amount of time to be performed, wherein less time is required to perform a first one of the checks than is required to perform a second one of the checks, and wherein the first check is performed before the second check is performed, and wherein the second check is only performed if performance of the first check does not provide a definitive determination as to whether or not said at least one of the design rules has been complied with by the network comprising the node being evaluated.

11. The method of claim 10, wherein the order in which the checks are performed has been pre-selected to maximize efficiency in the method of evaluating the nodes for compliance with the design rules.

12. The method of claim 11, wherein the first check performed is capable of being performed in a lesser amount of time than the amount of time required to perform any check other than the first check, and wherein each of the checks is capable of definitively determining that the network comprising the node being evaluated either does or does not comply with said at least one of the design rules.

13. The method of claim 12, wherein each check is performed in accordance with the amount of time required to perform each check, wherein the check requiring the shortest time to perform is performed first.

14. A computer-readable medium containing a computer program for evaluating nodes of a network of an integrated circuit to determine whether or not the network complies with various design rules, the program comprising:

code which evaluates at least one of the nodes of the network to determine whether or not the network complies with at least one of the design rules, wherein said at least one of the design rules is comprised of a plurality of checks, each check requiring a particular amount of time to be performed by the code, wherein less time is required for the code to perform a first one of the checks than is required for the code to perform a second one of the checks, and wherein the first check is performed by the code before the second check is performed by the code, and wherein the second check is only performed if performance of the first check does not provide a definitive determination as to whether or not said at least one of the design rules has been complied with by the network comprising the node being evaluated.

15. The computer-readable medium of claim 14, wherein the code is comprised of a plurality of rules checking code segments, each rules checking code segment being associated with a particular design rule, each rule having a plurality of code segments associated therewith, each of the code segments associated with a particular rule corresponding to a particular check associated with the particular rule, each of the code segments associate with a particular rule requiring a particular amount of time to be performed, and wherein the code segments associated with a particular rule are executed in a predetermined order, wherein the predetermined order has been selected such that code segments associated with a particular rule that can be executed in a relatively small amount of time are executed before code segments associated with the particular rule that require a relatively large amount of time are executed.

16. The computer-readable medium of claim 15, wherein when a code segment associated with a particular rule has been executed, the next code segment in the predetermined order that is associated with the particular rule is only executed if the previously executed code segment does not provide a definitive determination as to whether or not the particular rule has been complied with by the network comprising the node being evaluated.

* * * * *